(12) United States Patent
Hayashi (10) Patent No.: US 11,251,017 B2
(45) Date of Patent: Feb. 15, 2022

(54) METHOD FOR EVALUATING SECONDARY OPTICAL SYSTEM OF ELECTRON BEAM INSPECTION DEVICE

(71) Applicant: EBARA CORPORATION, Tokyo (JP)

(72) Inventor: Takehide Hayashi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 16/891,620

(22) Filed: Jun. 3, 2020

(65) Prior Publication Data
US 2020/0411279 A1 Dec. 31, 2020

(30) Foreign Application Priority Data
Jun. 25, 2019 (JP) .............................. JP2019-116821

(51) Int. Cl.
*H01J 37/28* (2006.01)
*H01J 37/244* (2006.01)
*G01N 23/225* (2018.01)

(52) U.S. Cl.
CPC ............ *H01J 37/28* (2013.01); *G01N 23/225* (2013.01); *H01J 37/244* (2013.01); *H01J 2237/202* (2013.01); *H01J 2237/2817* (2013.01)

(58) Field of Classification Search
CPC .. H01J 37/00; H01J 37/02; H01J 37/28; H01J 37/244; H01J 37/147; H01J 37/153; H01J 37/20; H01J 37/22; H01J 37/224; H01J 37/226; H01J 37/228; H01J 37/26; H01J 37/261; H01J 2237/202; H01J 2237/2817; H01J 2237/282; G01N 23/225
USPC ................................ 250/306, 307, 310, 311
See application file for complete search history.

(56) References Cited

U.S. PATENT DOCUMENTS

| 6,765,217 B1 | 7/2004 | Nishimura et al. | |
| 2012/0235036 A1* | 9/2012 | Hatakeyama | H01J 37/28 250/310 |
| 2018/0158647 A1* | 6/2018 | Niu | H01J 37/20 |

FOREIGN PATENT DOCUMENTS

JP  H11-312485 A  11/1999

* cited by examiner

*Primary Examiner* — Jason L McCormack
(74) *Attorney, Agent, or Firm* — Pearne & Gordon LLP (57) ABSTRACT

A method for evaluating a secondary optical system of an electron beam inspection device provided with a primary optical system that irradiates a sample placed at an observation target position with an electron beam emitted from an electron source, and the secondary optical system that forms, on a detector, an enlarged image of an electron beam generated from the sample or an electron beam transmitted through the sample. The method includes: placing a photoelectric surface at the observation target position; irradiating the photoelectric surface with laser; forming an enlarged image of an electron beam generated from the photoelectric surface on the detector by the secondary optical system; and evaluating the secondary optical system based on an electron beam image obtained by the detector.

19 Claims, 8 Drawing Sheets

METHOD FOR EVALUATING SECONDARY OPTICAL SYSTEM OF ELECTRON BEAM INSPECTION DEVICE

CROSS-REFERENCE TO RELATED APPLICATIONS

This application claims the benefit of Japanese Priority Patent Application JP 2019-116821 filed on Jun. 25, 2019, the entire contents of which are incorporated herein by reference.

FIELD

The present technology relates to a method for evaluating a secondary optical system of an electron beam inspection device.

BACKGROUND AND SUMMARY

Conventionally, an electron beam inspection device using an electron beam has been used to inspect for a defect or the like in a pattern formed on a surface of a sample. Here, the sample includes an exposure mask, an EUV mask, a nano-imprint mask (and template), a semiconductor wafer, a substrate for an optical element, a substrate for an optical circuit, and the like. These include ones having a pattern and ones having no pattern. Some of those having a pattern have unevenness while some of those have no unevenness. A pattern is formed by a different material for patterns without unevenness. Some of those having no pattern are coated with an oxide film while some of those are not coated with an oxide film.

In an electron beam inspection device, an electron beam emitted from an electron source passes through a primary optical system (also referred to as an irradiation optical system) and a surface of a sample is irradiated with the electron beam, and an electron beam generated on the surface of the sample or an electron beam transmitted through the sample is transmitted through a secondary optical system (also referred to as an imaging optical system) to form an image on a detector.

Here, in developing an electron beam inspection device, an electron beam generated from a surface of a sample or an electron beam transmitted through the sample is required in order to evaluate the secondary optical system. However, when the primary optical system is not completed, the surface of the sample is not to be properly irradiated with the electron beam emitted from the electron source, which disables proper preparation of an electron beam generated from the surface of the sample or an electron beam transmitted through the sample. Therefore, in a conventional electron beam inspection device, it is not possible to evaluate the secondary optical system until the primary optical system is completed, and there has been a problem that the development speed is delayed.

JP H11-312485 A proposes a method of arranging a self-luminous cold cathode (electron emitting element) at a position of a sample, and separately adjusting a secondary optical system by using an electron beam emitted from the cold cathode.

However, the method disclosed in JP H11-312485 A has a problem of high cost due to the use of the cold cathode (electron emitting element) having a complicated laminated structure.

It is desired to provide a method that can separately evaluate the secondary optical system of the electron beam inspection device at low cost.

A method according to an embodiment is a method for evaluating a secondary optical system of an electron beam inspection device provided with a primary optical system that irradiates a sample placed at an observation target position with an electron beam emitted from an electron source, and the secondary optical system that forms, on a detector, an enlarged image of an electron beam emitted from the sample or an electron beam transmitted through the sample. The method includes: placing a photoelectric surface at the observation target position; irradiating the photoelectric surface with laser light; forming an enlarged image of an electron beam emitted from the photoelectric surface on the detector by the secondary optical system; and evaluating the secondary optical system based on an electron beam image obtained by the detector.

A secondary optical system evaluation kit according to an embodiment is a secondary optical system evaluation kit used in a method for evaluating a secondary optical system of an electron beam inspection device provided with a primary optical system that irradiates a sample placed at an observation target position with an electron beam emitted from an electron source, and the secondary optical system that forms, on a detector, an enlarged image of an electron beam emitted from the sample or an electron beam transmitted through the sample. The method includes: placing a photoelectric surface at the observation target position; irradiating the photoelectric surface with laser light; forming an enlarged image of an electron beam emitted from the photoelectric surface on the detector by the secondary optical system; and evaluating the secondary optical system based on an electron beam image obtained by the detector. The secondary optical system evaluation kit includes: a chamber airtightly connected to the secondary optical system; a photoelectric surface arranged at the observation target position in the chamber; and a laser source that irradiates the photoelectric surface with laser light.

DETAILED DESCRIPTION OF NON-LIMITING EXAMPLE EMBODIMENTS

A method according to a first aspect of the embodiment is a method for evaluating a secondary optical system of an electron beam inspection device provided with a primary optical system that irradiates a sample placed at an observation target position with an electron beam emitted from an electron source, and the secondary optical system that forms, on a detector, an enlarged image of an electron beam emitted from the sample or an electron beam transmitted through the sample. The method includes: placing a photoelectric surface at the observation target position; irradiating the photoelectric surface with laser light; forming an enlarged image of an electron beam emitted from the photoelectric surface on the detector by the secondary optical system; and evaluating the secondary optical system based on an electron beam image obtained by the detector.

According to such an aspect, the secondary optical system can be separately evaluated by arranging the photoelectric surface at the observation target position and using the electron beam emitted from the photoelectric surface. In addition, the photoelectric surface has a simpler configuration than that of the cold cathode (electron emitting element), so that the use at low cost is possible.

A method according to a second aspect of the embodiment is a method according to the first aspect, in which a predetermined pattern is formed on the photoelectric surface.

According to such an aspect, the secondary optical system can be accurately evaluated by comparing a pattern of an electron beam image obtained by the detector with a pattern formed in advance on the photoelectric surface, and measuring distortion.

A method according to a third aspect of the embodiment is a method according to the first or second aspect, in which the secondary optical system has an objective lens and an imaging lens arranged between the objective lens and the detector.

A method according to a fourth aspect of the embodiment is a method according to the third aspect, in which the photoelectric surface is irradiated with the laser light from a side opposite to a position of the objective lens.

According to such an aspect, the photoelectric surface can be easily irradiated with laser light without being blocked by the objective lens.

A method according to a fifth aspect of the embodiment is a method according to any one of the first to fourth aspects, in which the photoelectric surface disposed in a chamber is irradiated with the laser light in a state where a lens barrel of the primary optical system is separated from a lens barrel of the secondary optical system.

According to such an aspect, it is not necessary to evacuate an inside of the lens barrel of the primary optical system when evaluating the secondary optical system, which can reduce a time required for evacuation.

A method according to a sixth aspect of the embodiment is a method according to any one of the first to fifth aspects, in which the laser light is emitted from a laser source arranged outside a chamber and transmitted through a view port provided on the chamber, and the photoelectric surface disposed in the chamber is irradiated with the laser light.

According to such an aspect, the laser source can be easily cooled since the laser source is arranged outside the chamber, which can inhibit high temperature of the laser source due to heat generation. Further, arranging the laser source outside the chamber enables a small chamber to be used, which reduces the cost. Further, using a small chamber can reduce a time required for evacuation of the chamber.

A secondary optical system evaluation kit according to a seventh aspect of the embodiment is a secondary optical system evaluation kit used in the method according to any one of the first to sixth aspects. The secondary optical system evaluation kit includes: a chamber airtightly connected to the secondary optical system; a photoelectric surface arranged at the observation target position in the chamber; and a laser source that irradiates the photoelectric surface with laser light.

Hereinafter, specific examples of the embodiments will be described in detail with reference to the accompanying drawings. It should be noted that, in the following descriptions and drawings used in the following descriptions, parts that may be identically configured are denoted by identical reference numerals, and will not be described in duplication.

First Embodiment

Figure 1:
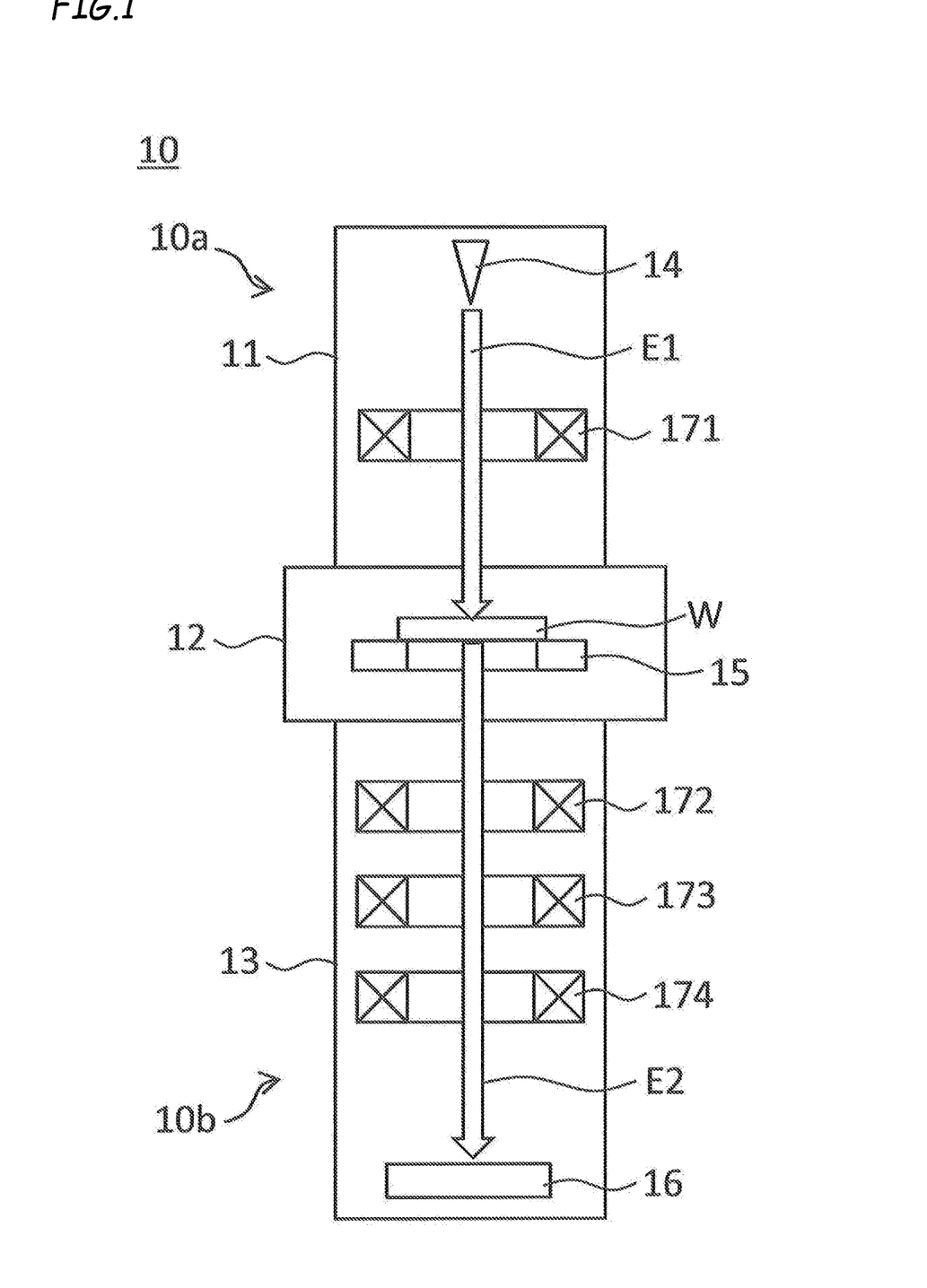
FIG. 1 is a view illustrating a schematic configuration of an electron beam inspection device according to a first embodiment.

FIG. 1 is a view illustrating a schematic configuration of an electron beam inspection device 10 according to a first embodiment.

As shown in FIG. 1, the electron beam inspection device 10 according to the first embodiment is an electron beam inspection device of a transmission type, and has a chamber 12 that accommodates a sample W to be inspected, a primary optical system 10a (also referred to as an irradiation optical system), and a secondary optical system 10b (also referred to as an imaging optical system).

Among these, in the chamber 12, a stage 15 that holds the sample W at an observation target position is arranged. The sample W to be inspected may be a silicon wafer, a glass mask, a semiconductor substrate, a semiconductor pattern substrate, a substrate having a metal film, or the like.

The primary optical system 10a has a lens barrel 11, an electron source 14, and an irradiation system lens 171. The electron source 14 and the irradiation system lens 171 are disposed in the lens barrel 11.

The lens barrel 11 of the primary optical system 10a has a cylindrical shape, and one end is airtightly connected to the chamber 12. The electron source 14 is provided at the other end of the lens barrel 11.

As the electron source 14, for example, an electron gun such as LaB6 is used. The irradiation system lens 171 is arranged on a downstream side in a traveling direction of an electron beam E1 emitted from the electron source 14, and irradiates the sample W arranged at the observation target position in the chamber 12 with the electron beam E1 emitted from the electron source 14.

The secondary optical system 10b has a lens barrel 13, an objective lens 172, an intermediate lens 173, an imaging lens 174, and a detector 16. The objective lens 172, the intermediate lens 173, the imaging lens 174, and the detector 16 are disposed in the lens barrel 13.

The lens barrel 13 of the secondary optical system 10b has a cylindrical shape, and one end is airtightly connected to the chamber 12 on a side opposite to the lens barrel 11 of the primary optical system 10a. The detector 16 is provided at the other end of the lens barrel 13.

The objective lens 172, the intermediate lens 173, and the imaging lens 174 are arranged aligned in this order between the sample W in the chamber 12 and the detector 16, and forms an enlarged image of an electron beam E2 transmitted through the sample W, on the detector 16.

The detector 16 is a camera that detects a signal electron guided by the imaging lens 174, and has a plurality of pixels on its surface. Various two-dimensional sensors can be used as the detector 16. For example, a charge coupled device (CCD) or a time delay integration (TDI)-CCD may be used as the detector 16. These are sensors that convert electrons into light and then detect the signal. Electrons are converted into light with use of photoelectric conversion or scintillator, and then image information of the light is transmitted to the TDI and detected. An image signal from the detector 16 is sent to an image processing device (not shown), and defect detection or defect determination on a surface of the sample W is performed by image processing.

Figure 2:
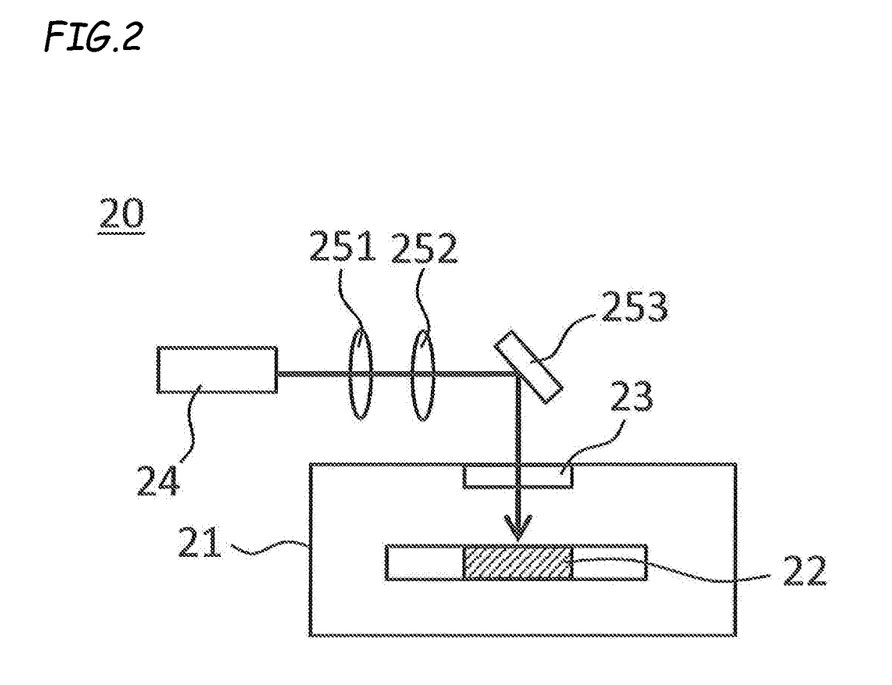
FIG. 2 is a view illustrating a schematic configuration of a secondary optical system evaluation kit according to the first embodiment.

Next, a secondary optical system evaluation kit 20 will be described with reference to FIG. 2. FIG. 2 is a view illustrating a schematic configuration of the secondary optical system evaluation kit 20.

As shown in FIG. 2, the secondary optical system evaluation kit 20 has a chamber 21, a photoelectric surface 22 arranged at an observation target position in the chamber 21, a laser source 24, and lenses 251 and 252 and a mirror 253 that guide laser light emitted from the laser source 24 to the photoelectric surface 22.

The photoelectric surface 22 is a member that receives light and emits electrons, and may be produced, for example, by coating a substrate such as glass with a photoelectron emitting material including an alkali metal having a small work function. On the photoelectric surface 22, a predetermined pattern (for example, a mark formed in a lattice shape) may be formed. In this case, when the photoelectric surface 22 is irradiated with the laser light, electrons are emitted in a predetermined pattern shape in a range irradiated with the laser light.

The laser source 24, the lenses 251 and 252, and the mirror 253 are arranged outside the chamber 21. The chamber 21 is provided with a view port 23 that transmits laser light emitted from the laser source 24 and guided by the lenses 251 and 252 and the mirror 253, and the photoelectric surface 22 is irradiated with the laser light transmitted through the view port 23. On an optical path of laser light between the laser source 24 and the view port 23, there may be arranged a homogenizer (not shown) that converts (intensity distribution conversion) Gaussian distribution laser light into uniform distribution laser light.

Figure 3:
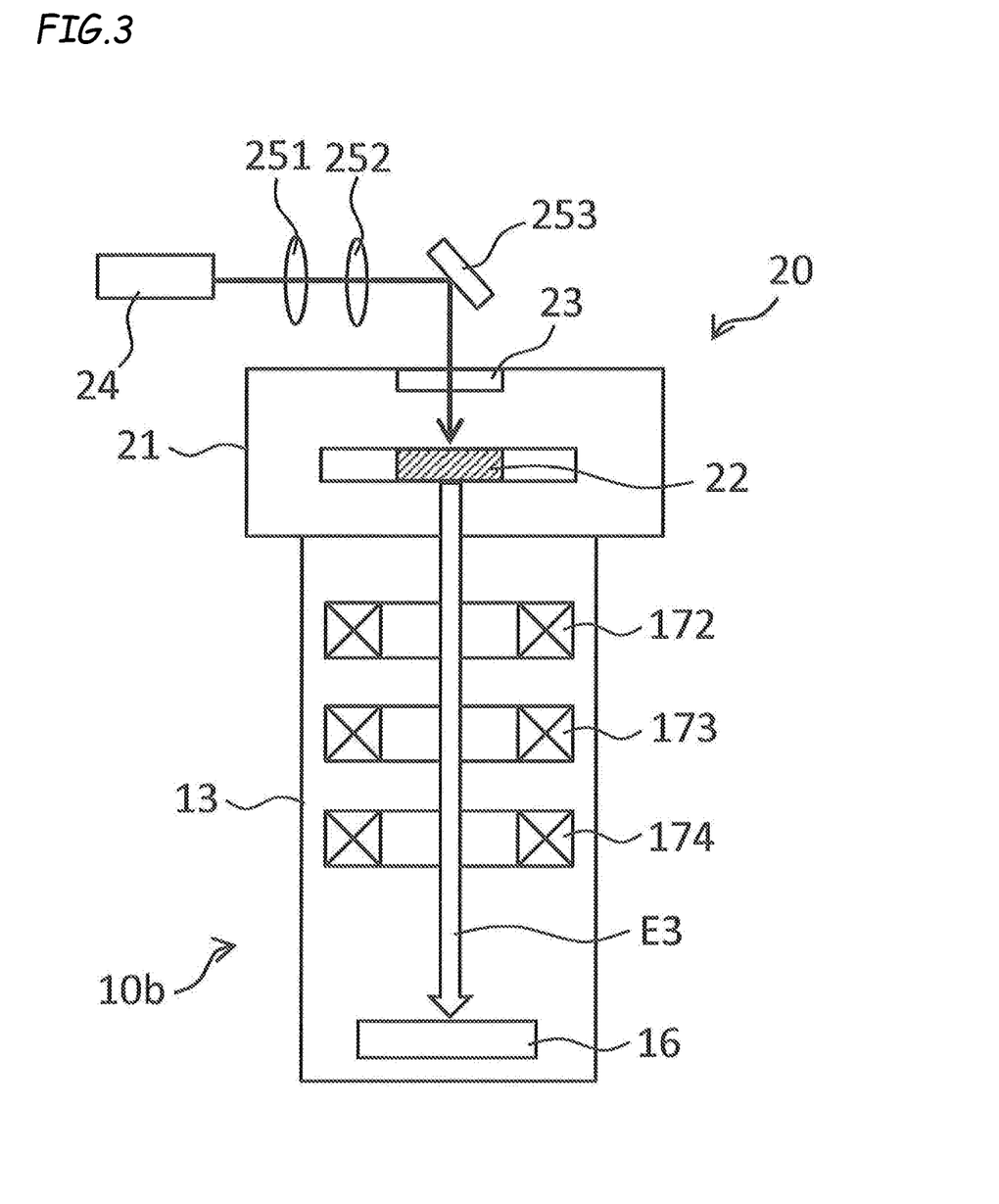
FIG. 3 is a view for explaining a method for evaluating a secondary optical system of the electron beam inspection device according to the first embodiment.

To the chamber 21 on a side opposite to a part where the view port 23 is provided, the lens barrel 13 of the above-described secondary optical system 10b can be airtightly connected (see FIG. 3).

Next, a method for evaluating the secondary optical system 10b of the electron beam inspection device 10 will be described with reference to FIG. 3.

First, as shown in FIG. 3, the lens barrel 13 of the secondary optical system 10b of the electron beam inspection device 10 is airtightly connected to the chamber 21 of the secondary optical system evaluation kit 20, and an inside of the lens barrel 13 and the chamber 21 is evacuated.

Next, the photoelectric surface 22 is arranged at the observation target position in the chamber 21, and a predetermined voltage is applied to the photoelectric surface 22.

Then, laser light is emitted from the laser source 24. The laser light emitted from the laser source 24 is transmitted through the view port 23 provided on the chamber 21, and the photoelectric surface 22 is irradiated with the laser light. In the example shown in FIG. 3, the laser light irradiates the photoelectric surface 22 from a side opposite to a position of the objective lens 172. This inhibits blocking of the laser light by the objective lens 172.

From the photoelectric surface 22 irradiated with the laser light, an electron beam E3 including photoelectrons is emitted. The objective lens 172, the intermediate lens 173, and the imaging lens 174 of the secondary optical system 10b form an enlarged image of the electron beam E3 generated from the photoelectric surface 22, on the detector 16.

An image signal from the detector 16 is sent to an image processing device (not shown), and the secondary optical system 10b is evaluated by image processing. That is, in the image processing device (not shown), it is evaluated whether or not the secondary optical system 10b can be used as a product (whether or not specifications are satisfied) based on an electron beam image obtained by the detector 16. Specifically, for example, a pattern of the electron beam image obtained by the detector 16 is compared with a pattern formed in advance on the photoelectric surface 22, distortion is measured, and the secondary optical system 10b is evaluated based on a result of the measurement of distortion.

As described above, conventionally, in developing the electron beam inspection device 10, an electron beam generated from a surface of the sample W or an electron beam E2 transmitted through the sample W is required in order to evaluate the secondary optical system 10b. However, when the primary optical system 10a is not completed, the surface of the sample W is not to be properly irradiated with the electron beam E1 emitted from the electron source 14, which disables proper preparation of an electron beam generated from the surface of the sample W or the electron beam E2 transmitted through the sample W. Therefore, in the conventional electron beam inspection device 10, it is not possible to evaluate the secondary optical system 10b until the primary optical system 10a is completed, and there has been a problem that the development speed is delayed.

On the other hand, according to the present embodiment, when the secondary optical system 10b is evaluated, the secondary optical system 10b can be separately evaluated by arranging the photoelectric surface 22 at the observation target position, and using the electron beam E3 emitted from the photoelectric surface 22. This enables the development of the primary optical system 10a and the development of the secondary optical system 10b to be advanced in parallel, and improves the development speed. In addition, the photoelectric surface 22 has a simpler configuration than that of a cold cathode (electron emitting element), so that the use at low cost is possible.

Further, according to the present embodiment, since a predetermined pattern is formed on the photoelectric surface 22, the secondary optical system 10b can be accurately evaluated by comparing a pattern of an electron beam image obtained by the detector 16 with the pattern formed in advance on the photoelectric surface 22, and measuring distortion.

Further, according to the present embodiment, since laser light emitted from the laser source 24 irradiates the photoelectric surface 22 from a side opposite to a position of the objective lens 172, the photoelectric surface 22 can be easily irradiated with the laser light without being blocked by the objective lens 172.

Further, according to the present embodiment, the laser source 24 can be easily cooled since the laser source 24 is arranged outside the chamber 21, which can inhibit high temperature of the laser source 24 due to heat generation. Further, arranging the laser source 24 outside the chamber 21 enables a small chamber 21 to be used, which reduces the cost. Further, using the small chamber 21 can reduce a time required for evacuation of the chamber 21.

Figure 4:
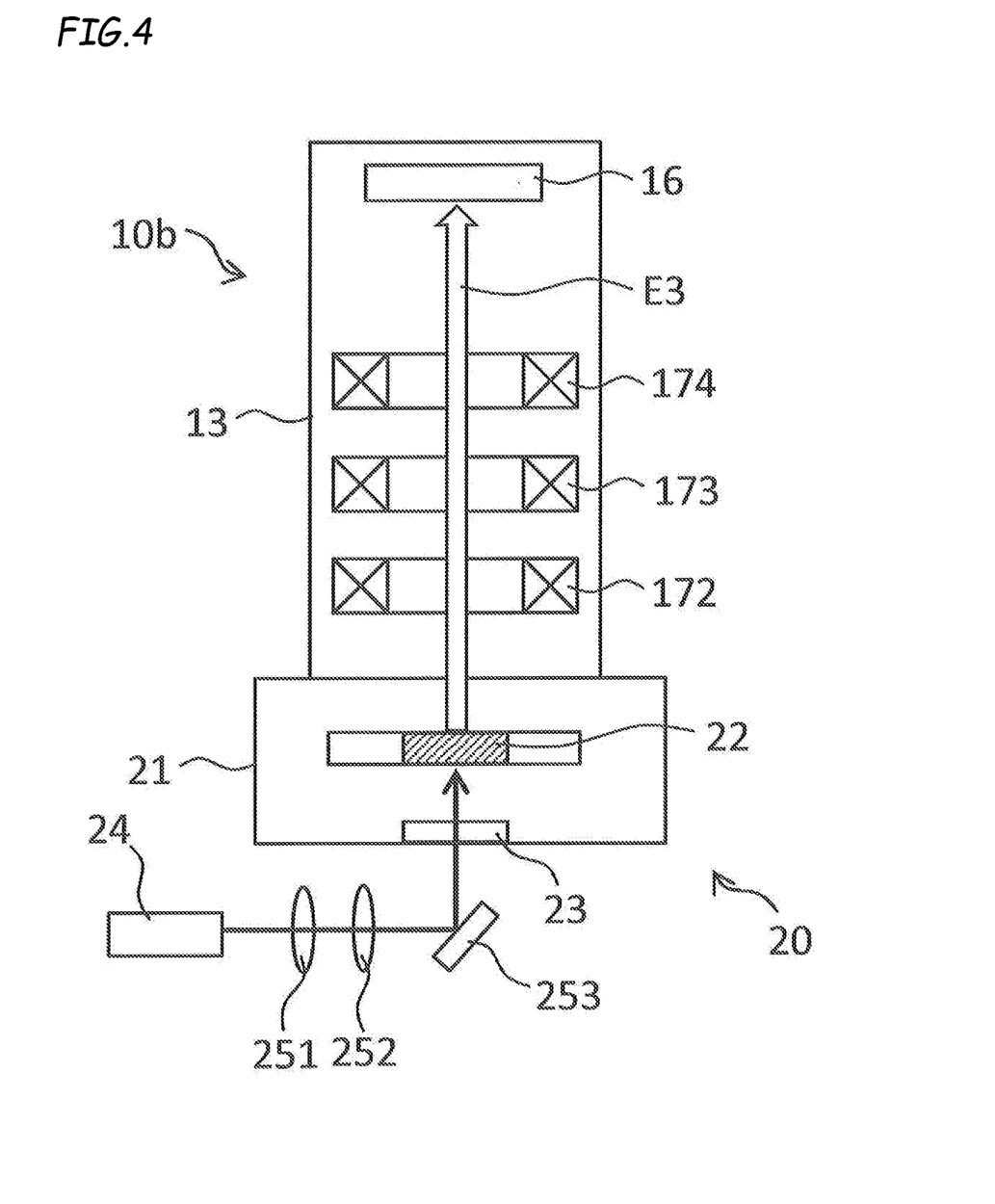
FIG. 4 is a view for explaining a method for evaluating a secondary optical system according to a modification of the first embodiment.

Note that, in the above-described embodiment, as shown in FIG. 3, the secondary optical system evaluation kit 20 is used by being arranged above the secondary optical system 10b, but the present invention is not limited to this. As shown in FIG. 4, the secondary optical system 10b may be vertically reversed, and the secondary optical system evaluation kit 20 may be used by being arranged below the secondary optical system 10b.

The first embodiment has been described in detail above, but the present technology is not limited to the above-described first embodiment, and various modifications can be made to the above-described first embodiment. Hereinafter, an example of a modification will be described with reference to the drawings. In the following description and the drawings used in the following description, parts that may be configured similarly to the above-described embodiment will be denoted by the same reference numerals as those used in corresponding parts in the above-described embodiment, and redundant descriptions will be omitted.

Second Embodiment

Figure 5:
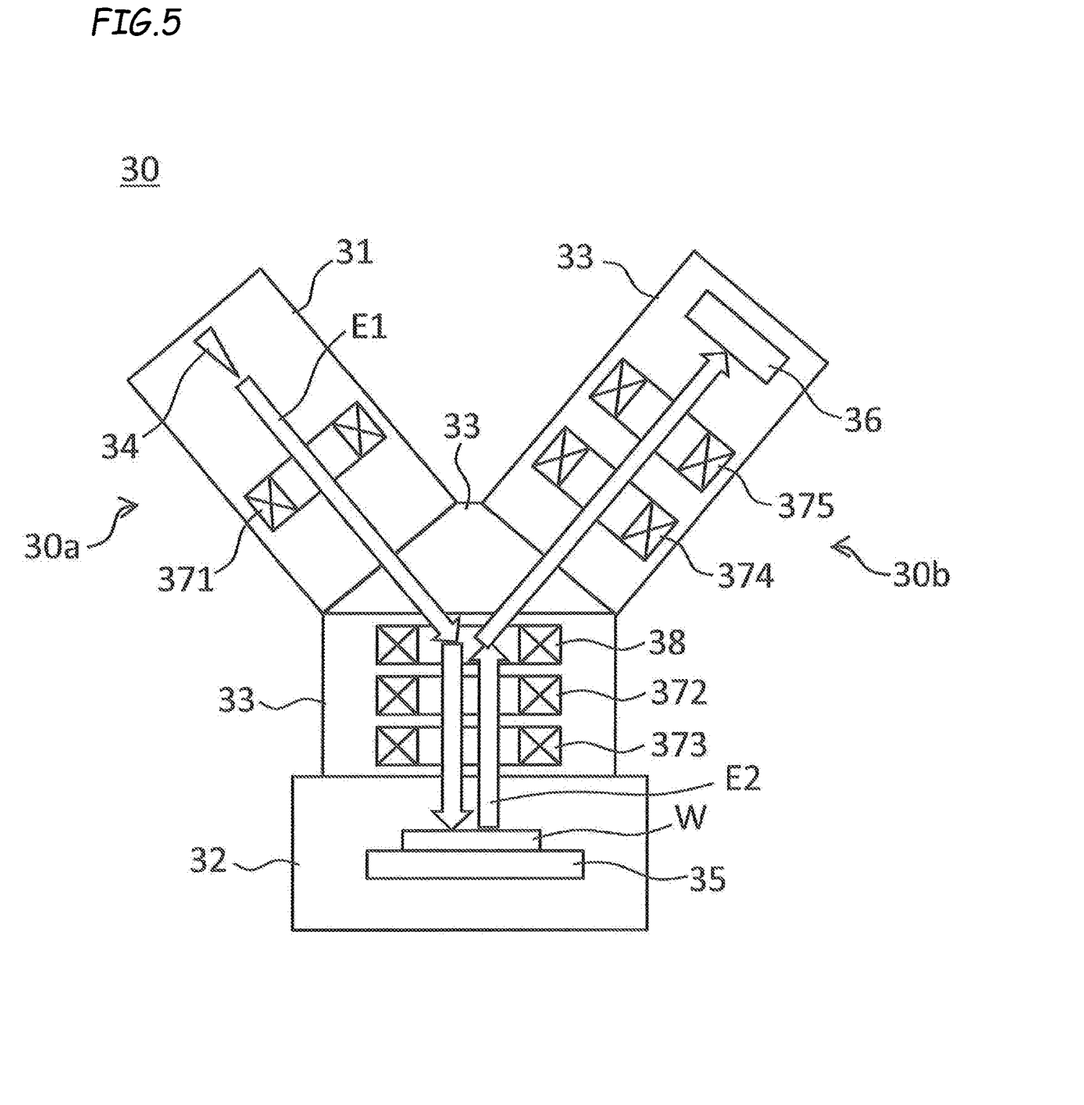
FIG. 5 is a view illustrating a schematic configuration of an electron beam inspection device according to a second embodiment.

FIG. 5 is a view illustrating a schematic configuration of an electron beam inspection device 30 according to a second embodiment.

As shown in FIG. 5, the electron beam inspection device 30 according to the second embodiment is an electron beam inspection device of a mapping projection type, and has a chamber 32 that accommodates a sample W to be inspected, a primary optical system 30a (also referred to as an irradiation optical system), and a secondary optical system 30b (also referred to as an imaging optical system).

Among these, in the chamber 32, a stage 35 that holds the sample W at an observation target position is arranged. The sample W to be inspected may be a silicon wafer, a glass mask, a semiconductor substrate, a semiconductor pattern substrate, a substrate having a metal film, or the like.

The primary optical system 30a has a lens barrel 31, an electron source 34, and an irradiation system lens 371. The electron source 34 and the irradiation system lens 371 are disposed in the lens barrel 11.

The lens barrel 31 of the primary optical system 30a has a cylindrical shape, and one end is airtightly connected to a lens barrel 33 of the secondary optical system 30b. The electron source 34 is provided at the other end of the lens barrel 31.

As the electron source 34, for example, an electron gun such as LaB6 is used. The irradiation system lens 371 is arranged on a downstream side in a traveling direction of an electron beam E1 emitted from the electron source 34, and irradiates the sample W arranged at the observation target position in the chamber 32 with the electron beam E1 emitted from the electron source 34.

The secondary optical system 30b has the lens barrel 33, a Wien filter 38, an intermediate lens 372, an objective lens 373, imaging lenses 374 and 375, and a detector 36. The Wien filter 38, the objective lens 373, the intermediate lens 372, the imaging lenses 374 and 375, and the detector 36 are disposed in the lens barrel 33.

The lens barrel 33 of the secondary optical system 30b has a cylindrical shape, and one end is airtightly connected to the chamber 32. The detector 36 is provided at the other end of the lens barrel 33.

The objective lens 373, the intermediate lens 372, the Wien filter 38, and the imaging lenses 374 and 375 are arranged aligned in this order between the sample W in the chamber 32 and the detector 36, and form an enlarged image of an electron beam E2 including secondary electrons emitted from the sample W and reflected electrons (also referred to as mirror electrons), on the detector 36. Note that the Wien filter 38 is a beam separator. The Wien filter 38 allows the electron beam E11 having passed through the irradiation system lens 371 and entering from obliquely above, to pass through so as to enter the sample W on the stage 35 almost perpendicularly. Further, the Wien filter 38 guides the electron beam E2 emitted from the sample W to the imaging lens 374 by deflecting to an angle different from that of the incident electron beam E1.

The detector 36 is a camera that detects a signal electron guided by the imaging lenses 374 and 375, and has a plurality of pixels on its surface. A configuration of the detector 36 is similar to the configuration of the detector 16 in the above-described first embodiment, and a description thereof will be omitted. An image signal from the detector 36 is sent to an image processing device (not shown), and defect detection or defect determination on a surface of the sample W is performed by image processing.

Next, a method for evaluating the secondary optical system 30b of the electron beam inspection device 30 will be described with reference to FIG. 6.

Figure 6:
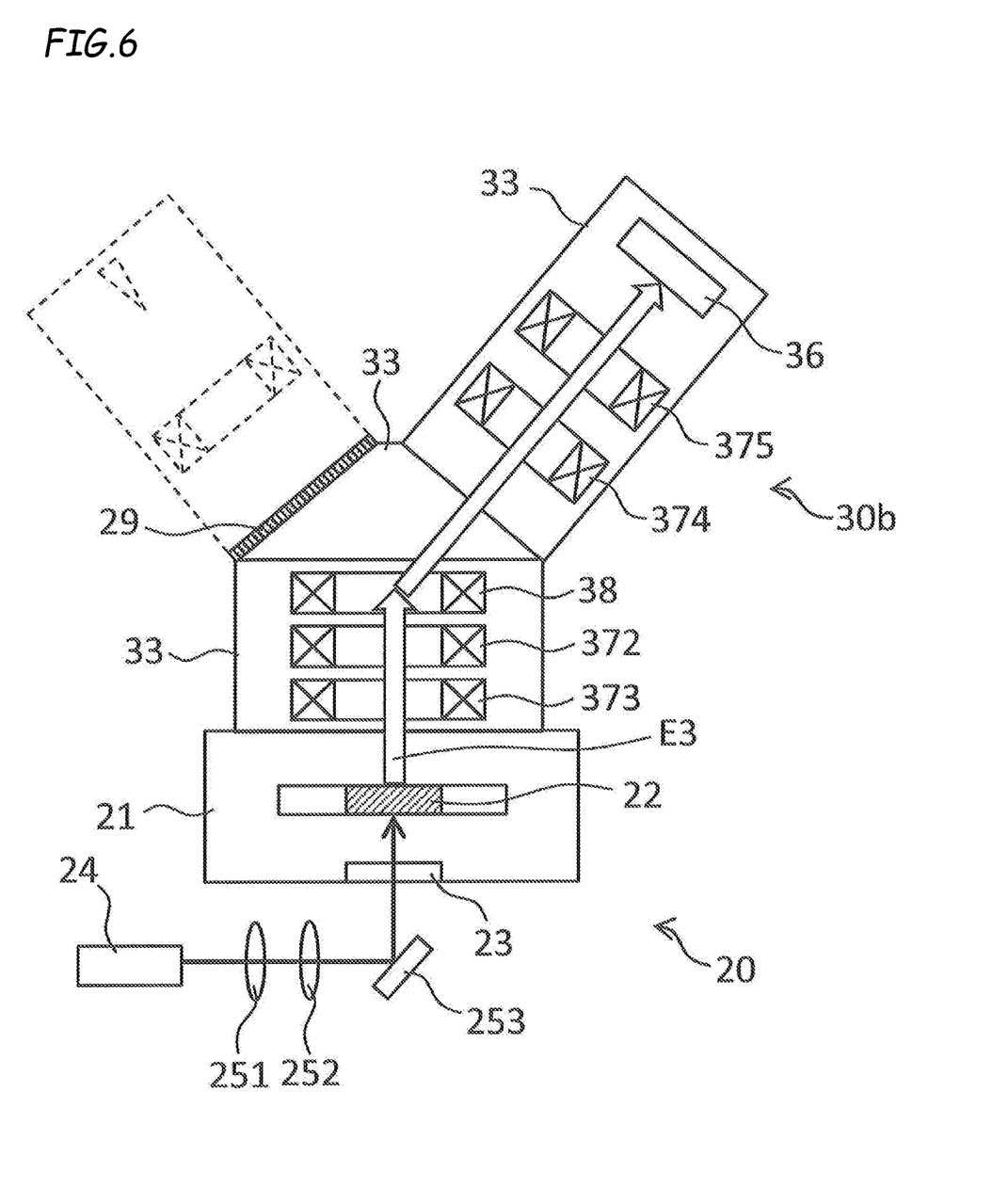
FIG. 6 is a view for explaining a method for evaluating a secondary optical system of the electron beam inspection device according to the second embodiment.

First, as shown in FIG. 6, the lens barrel 31 of the primary optical system 30a of the electron beam inspection device 30 is separated from the lens barrel 33 of the secondary optical system 30b, and a connection part is airtightly sealed by a closing lid 29. In this state, the lens barrel 33 of the secondary optical system 30b is airtightly connected to a chamber 21 of a secondary optical system evaluation kit 20, and an inside of the lens barrel 33 and the chamber 21 is evacuated. Here, the lens barrel 31 of the primary optical system 30a is separated from the lens barrel 33 of the secondary optical system 30b, and the connection part is airtightly sealed by the closing lid 29. This eliminates necessity of evacuation of an inside of the lens barrel 31 of the primary optical system 30a, and therefore can reduce a time required for evacuation.

Next, the photoelectric surface 22 is arranged at the observation target position in the chamber 21, and a predetermined voltage is applied to the photoelectric surface 22.

Then, laser light is emitted from the laser source 24. The laser light emitted from the laser source 24 is transmitted through the view port 23 provided on the chamber 21, and the photoelectric surface 22 is irradiated with the laser light. In the example shown in FIG. 6, the photoelectric surface 22 is irradiated with the laser light from a side opposite to a position of the objective lens 373. This inhibits blocking of the laser light by the objective lens 373.

From the photoelectric surface 22 irradiated with the laser light, an electron beam E3 including photoelectrons is emitted. The objective lens 373, the intermediate lens 372, the Wien filter 38, and the imaging lenses 374 and 375 of the secondary optical system 30b form an enlarged image of the electron beam E3 emitted from the photoelectric surface 22, on the detector 36.

An image signal from the detector 36 is sent to an image processing device (not shown), and the secondary optical system 30b is evaluated by image processing. That is, in the image processing device (not shown), it is evaluated whether or not the secondary optical system 30b can be used as a product (whether or not specifications are satisfied) based on an electron beam image obtained by the detector 36. Specifically, for example, a pattern of the electron beam image obtained by the detector 36 is compared with a pattern formed in advance on the photoelectric surface 22, distortion is measured, and the secondary optical system 30b is evaluated based on a result of the measurement of distortion.

According to the above-described second embodiment as well, an operational effect similar to that of the above-described first embodiment can be obtained.

Further, according to the second embodiment, the photoelectric surface 22 disposed in the chamber 21 is irradiated with the laser light in a state where the lens barrel 31 of the primary optical system 30a is separated from the lens barrel 33 of the secondary optical system 30b. Therefore, it is not necessary to evacuate an inside of the lens barrel 31 of the primary optical system 30a when evaluating the secondary optical system 30b, which can reduce a time required for evacuation.

Third Embodiment

Figure 7:
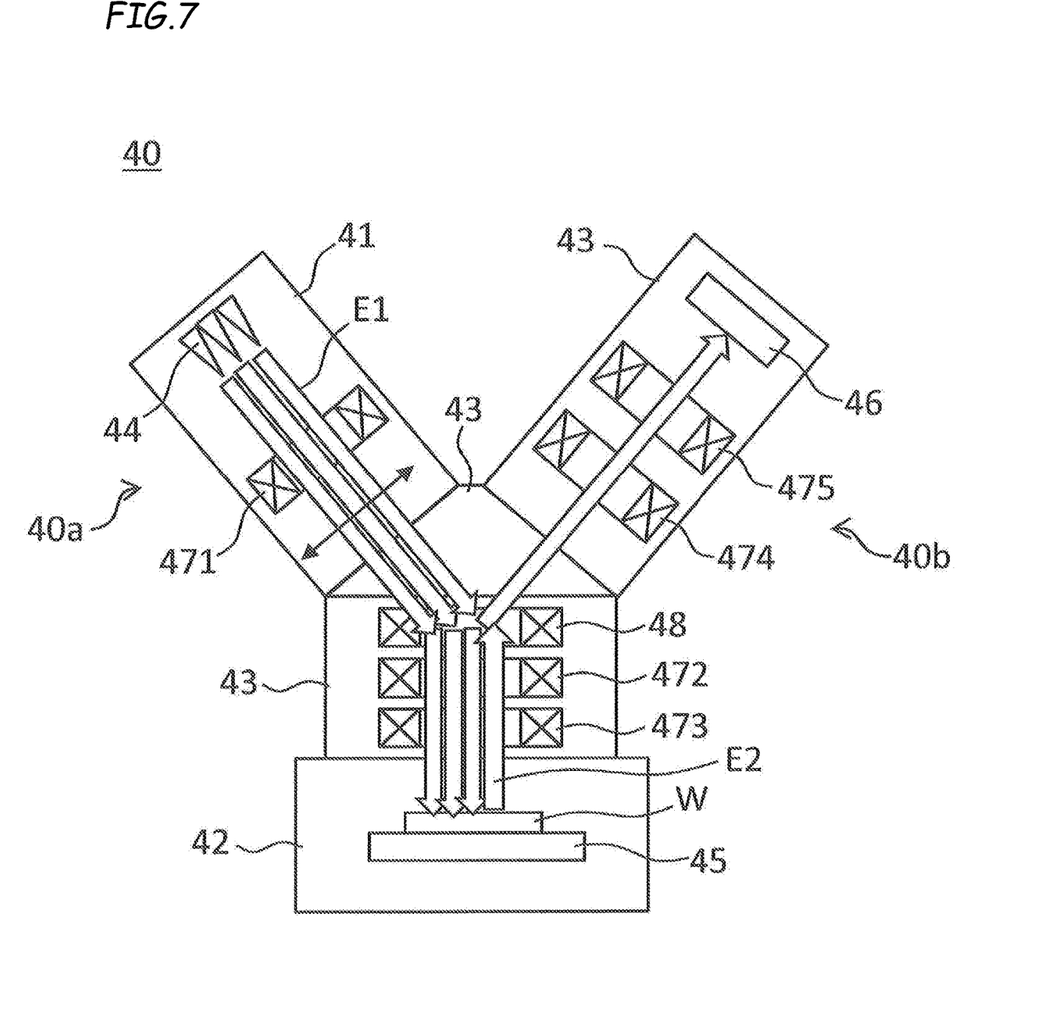
FIG. 7 is a view illustrating a schematic configuration of an electron beam inspection device according to a third embodiment.

FIG. 7 is a view illustrating a schematic configuration of an electron beam inspection device 40 according to a third embodiment.

As shown in FIG. 7, the electron beam inspection device 40 according to the third embodiment is an electron beam inspection device of a multi-beam scanning type, and has a chamber 42 that accommodates a sample W to be inspected, a primary optical system 40a (also referred to as an irradiation optical system), and a secondary optical system 40b (also referred to as an imaging optical system).

Among these, in the chamber 42, a stage 45 that holds the sample W at an observation target position is arranged. The sample W to be inspected may be a silicon wafer, a glass mask, a semiconductor substrate, a semiconductor pattern substrate, a substrate having a metal film, or the like.

The primary optical system 40a has a lens barrel 41, a multi-electron source 44, and an irradiation system lens 471. The multi-electron source 44 and the irradiation system lens 471 are disposed in the lens barrel 41.

The lens barrel 41 of the primary optical system 40a has a cylindrical shape, and one end is airtightly connected to a lens barrel 43 of the secondary optical system 40b. The multi-electron source 44 is provided at the other end of the lens barrel 41.

As the multi-electron source 44, for example, a plurality of electron guns such as LaB6 is used. The irradiation system lens 471 is arranged on a downstream side in a traveling direction of a plurality of electron beams (multi-beam) E1 emitted from the multi-electron source 44, and irradiates the sample W placed on the observation target position in the chamber 42 with the plurality of electron beams (multi-beam) E1 emitted from the multi-electron source 44.

The secondary optical system 40b has the lens barrel 43, a Wien filter 48, an intermediate lens 472, an objective lens 473, imaging lenses 474 and 475, and a detector 46. The Wien filter 48, the objective lens 473, the intermediate lens 472, the imaging lenses 474 and 475, and the detector 46 are disposed in the lens barrel 43.

The lens barrel 43 of the secondary optical system 40b has a cylindrical shape, and one end is airtightly connected to the chamber 42. The detector 46 is provided at the other end of the lens barrel 43.

The objective lens 473, the intermediate lens 472, the Wien filter 48, and the imaging lenses 474 and 475 are arranged aligned in this order between the sample W in the chamber 42 and the detector 46, and form an enlarged image of an electron beam E2 including secondary electrons emitted from the sample W and reflected electrons (also referred to as mirror electrons), on the detector 46. Note that the Wien filter 48 is a beam separator. The Wien filter 48 allows a plurality of electron beams (multi-beams) E1 having passed through the irradiation system lens 471 and entering from obliquely above, to pass through so as to enter the sample W on the stage 45 almost perpendicularly. Further, the Wien filter 48 guides the electron beam E2 emitted from the sample W to the imaging lens 474 by deflecting to an angle different from that of the incident electron beam E1.

The detector 46 is a camera that detects a signal electron guided by the imaging lenses 474 and 475, and has a plurality of pixels on its surface. A configuration of the detector 46 is similar to the configuration of the detector 16 in the above-described first embodiment, and a description thereof will be omitted. An image signal from the detector 46 is sent to an image processing device (not shown), and defect detection or defect determination on a surface of the sample W is performed by image processing.

Next, a method for evaluating the secondary optical system 40b of the electron beam inspection device 40 will be described with reference to FIG. 8.

Figure 8:
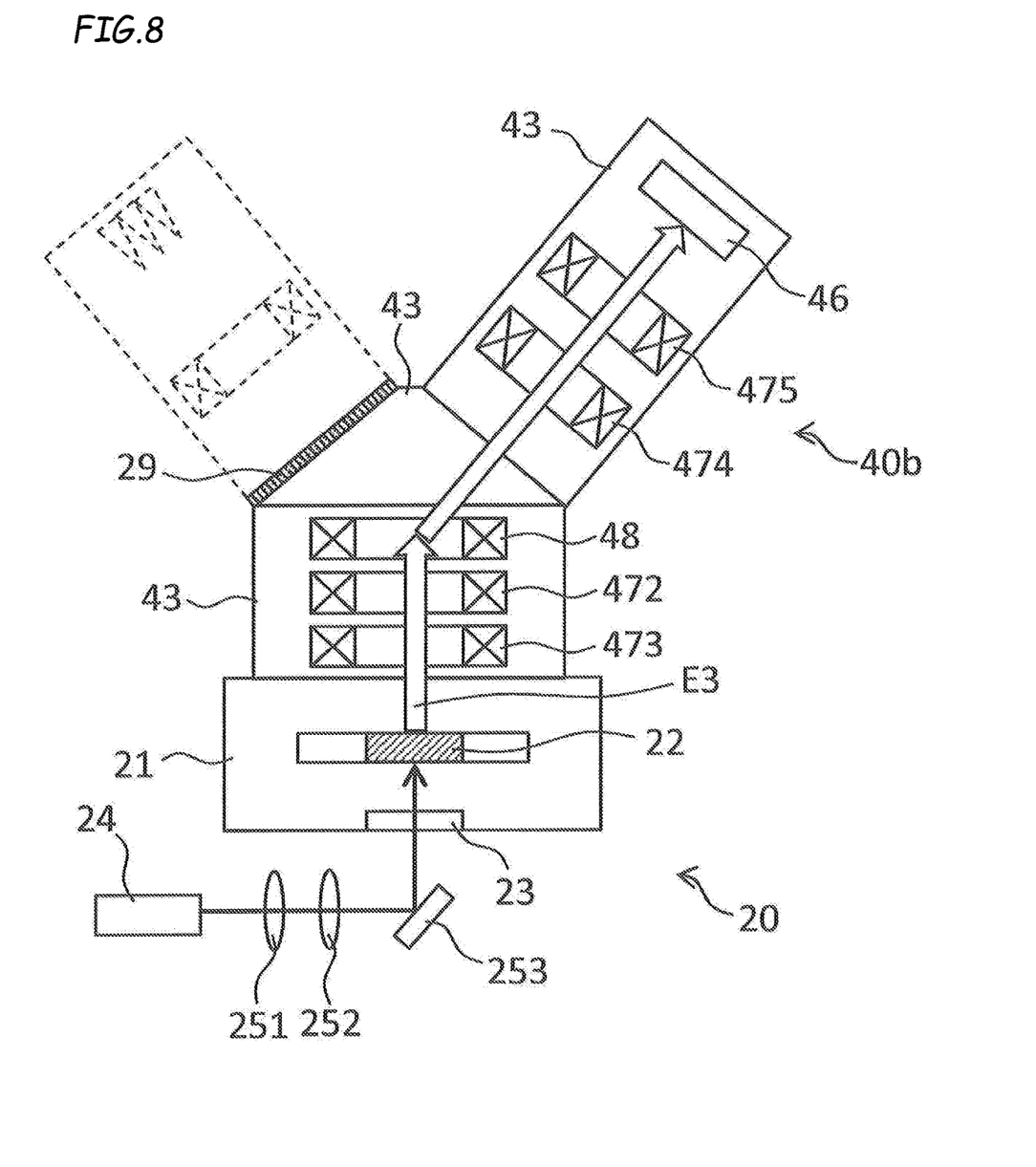
FIG. 8 is a view for explaining a method for evaluating a secondary optical system of the electron beam inspection device according to the third embodiment.

First, as shown in FIG. 8, the lens barrel 41 of the primary optical system 40a of the electron beam inspection device 40 is separated from the lens barrel 43 of the secondary optical system 40b, and a connection part is airtightly sealed by a closing lid 29. In this state, the lens barrel 43 of the secondary optical system 40b is airtightly connected to a chamber 21 of a secondary optical system evaluation kit 20, and an inside of the lens barrel 43 and the chamber 21 is evacuated. Here, the lens barrel 41 of the primary optical system 40a is separated from the lens barrel 43 of the secondary optical system 40b, and the connection part is airtightly sealed by the closing lid 29. This eliminates necessity of evacuation of an inside of the lens barrel 41 of the primary optical system 40a, and therefore can reduce a time required for evacuation.

Next, the photoelectric surface 22 is arranged at the observation target position in the chamber 21, and a predetermined voltage is applied to the photoelectric surface 22.

Then, laser light is emitted from the laser source 24. The laser light emitted from the laser source 24 is transmitted through the view port 23 provided on the chamber 21, and the photoelectric surface 22 is irradiated with the laser light. In the example shown in FIG. 8, the photoelectric surface 22 is irradiated with the laser light from a side opposite to a position of the objective lens 473. This inhibits blocking of the laser light by the objective lens 473.

From the photoelectric surface 22 irradiated with the laser light, an electron beam E3 including photoelectrons is emitted. The objective lens 473, the intermediate lens 472, the Wien filter 48, and the imaging lenses 474 and 475 of the secondary optical system 40b form an enlarged image of the electron beam E3 emitted from the photoelectric surface 22, on the detector 46.

An image signal from the detector 46 is sent to an image processing device (not shown), and the secondary optical system 40b is evaluated by image processing. That is, in the image processing device (not shown), it is evaluated whether or not the secondary optical system 40b can be used as a product (whether or not specifications are satisfied) based on an electron beam image obtained by the detector 46. Specifically, for example, a pattern of the electron beam image obtained by the detector 46 is compared with a pattern formed in advance on the photoelectric surface 22, distortion is measured, and the secondary optical system 40b is evaluated based on a result of the measurement of distortion.

According to the above-described third embodiment as well, an operational effect similar to that of the above-described second embodiment can be obtained.

Although the embodiments of the present technology have been described above by way of example, the scope of the present technology is not limited to these, and can be changed and modified in accordance with the purpose within the scope described in the claims. In addition, the embodiments can be appropriately combined within a range that does not cause contradiction in processing contents.

What is claimed is:

1. A method for evaluating a secondary optical system of an electron beam inspection device provided with a primary optical system that irradiates a sample placed at an observation target position with an electron beam emitted from an electron source, and the secondary optical system that forms, on a detector, an enlarged image of an electron beam emitted from said sample or an electron beam transmitted through said sample, the method comprising:

placing not said sample but a photoelectric surface on which a predetermined pattern is formed at the observation target position; irradiating the photoelectric surface with laser light; forming an enlarged image of an electron beam emitted from the photoelectric surface on the detector by the secondary optical system; comparing a pattern of the electron beam image obtained by the detector with the predetermined pattern formed on the photoelectric surface to measure a distortion of the pattern of the electron beam image obtained by the detector; and evaluating the secondary optical system based on the measured distortion of the pattern of the electron beam image obtained by the detector.

2. The method according to claim 1, wherein a predetermined pattern is formed on the photoelectric surface.

3. The method according to claim 1, wherein the secondary optical system has an objective lens and an imaging lens arranged between the objective lens and the detector.

4. The method according to claim 2, wherein the secondary optical system has an objective lens and an imaging lens arranged between the objective lens and the detector.

5. The method according to claim 3, wherein the photoelectric surface is irradiated with the laser light from a side opposite to a position of the objective lens.

6. The method according to claim 4, wherein the photoelectric surface is irradiated with the laser light from a side opposite to a position of the objective lens.

7. The method according to claim 1, wherein the photoelectric surface disposed in a chamber is irradiated with the laser light in a state where a lens barrel of the primary optical system is separated from a lens barrel of the secondary optical system.

8. The method according to claim 2, wherein the photoelectric surface disposed in a chamber is irradiated with the laser light in a state where a lens barrel of the primary optical system is separated from a lens barrel of the secondary optical system.

9. The method according to claim 3, wherein the photoelectric surface disposed in a chamber is irradiated with the laser light in a state where a lens barrel of the primary optical system is separated from a lens barrel of the secondary optical system.

10. The method according to claim 4, wherein the photoelectric surface disposed in a chamber is irradiated with the laser light in a state where a lens barrel of the primary optical system is separated from a lens barrel of the secondary optical system.

11. The method according to claim 5, wherein the photoelectric surface disposed in a chamber is irradiated with the laser light in a state where a lens barrel of the primary optical system is separated from a lens barrel of the secondary optical system.

12. The method according to claim 6, wherein the photoelectric surface disposed in a chamber is irradiated with the laser light in a state where a lens barrel of the primary optical system is separated from a lens barrel of the secondary optical system.

13. The method according to claim 1, wherein the laser light is emitted from a laser source arranged outside a chamber and transmitted through a view port provided on the chamber, and the photoelectric surface disposed in the chamber is irradiated with the laser light.

14. The method according to claim 2, wherein the laser light is emitted from a laser source arranged outside a chamber and transmitted through a view port provided on the chamber, and the photoelectric surface disposed in the chamber is irradiated with the laser light.

15. The method according to claim 3, wherein the laser light is emitted from a laser source arranged outside a chamber and transmitted through a view port provided on the chamber, and the photoelectric surface disposed in the chamber is irradiated with the laser light.

16. The method according to claim 4, wherein the laser light is emitted from a laser source arranged outside a chamber and transmitted through a view port provided on the chamber, and the photoelectric surface disposed in the chamber is irradiated with the laser light.

17. The method according to claim 5, wherein the laser light is emitted from a laser source arranged outside a chamber and transmitted through a view port provided on the chamber, and the photoelectric surface disposed in the chamber is irradiated with the laser light.

18. The method according to claim 6, wherein the laser light is emitted from a laser source arranged outside a chamber and transmitted through a view port provided on the chamber, and the photoelectric surface disposed in the chamber is irradiated with the laser light.

19. The method according to claim 7, wherein the laser light is emitted from a laser source arranged outside a chamber and transmitted through a view port provided on the chamber, and the photoelectric surface disposed in the chamber is irradiated with the laser light.

* * * * *